(12) United States Patent
Ono (10) Patent No.: US 11,930,623 B2
(45) Date of Patent: Mar. 12, 2024

(54) BOARD STRUCTURE, ELECTRONIC APPARATUS, AND METHOD OF MANUFACTURING BOARD STRUCTURE

(71) Applicant: FUJIFILM BUSINESS INNOVATION CORP., Tokyo (JP)

(72) Inventor: Takanobu Ono, Kanagawa (JP)

(73) Assignee: FUJIFILM Business Innovation Corp., Tokyo (JP)

( * ) Notice: Subject to any disclaimer, the term of this patent is extended or adjusted under 35 U.S.C. 154(b) by 174 days.

(21) Appl. No.: 17/539,910

(22) Filed: Dec. 1, 2021

(65) Prior Publication Data

US 2023/0058602 A1 Feb. 23, 2023

(30) Foreign Application Priority Data

Aug. 23, 2021 (JP) ................... 2021-135481

(51) Int. Cl.
*H05K 7/20* (2006.01)
*H05K 1/02* (2006.01)

(52) U.S. Cl.
CPC ....... *H05K 7/2039* (2013.01); *H05K 7/20145* (2013.01); *H05K 7/20154* (2013.01); *H05K 1/0203* (2013.01)

(58) Field of Classification Search
CPC .............. H07K 7/2039; H05K 1/141; H05K 7/20–2099; G06F 1/185; G06F 1/20–206; H01L 23/34–4735
See application file for complete search history.

(56) References Cited

U.S. PATENT DOCUMENTS

| 7,495,920 | B2 * | 2/2009 | Chen .................... H01L 23/467 |
| | | | 361/709 |
| 7,529,090 | B2 * | 5/2009 | Peng .................... H01L 23/427 |
| | | | 165/185 |
| 7,990,712 | B2 * | 8/2011 | Fang ........................ G06F 1/20 |
| | | | 361/679.52 |
| 10,703,490 | B2 * | 7/2020 | Engelhardt ........ H05K 7/20409 |
| 10,806,050 | B1 * | 10/2020 | Chou ................. H05K 7/20172 |

(Continued)

FOREIGN PATENT DOCUMENTS

| CN | 101208003 | A | * | 6/2008 | ......... H05K 7/20154 |
| DE | 202012101073 | U1 | * | 7/2012 | ............. G06F 1/183 |

(Continued)

*Primary Examiner* — Zachary Pape
*Assistant Examiner* — Steven Ngo
(74) *Attorney, Agent, or Firm* — Oliff PLC (57) ABSTRACT

A board structure includes: a board with a heat generating element; a heat sink including a plate-shaped base member with one face contacting the heat generating element, and plural fins side by side on another face of the base member, the fins extending in a cooling air flow direction, the fins having distal ends downstream in the flow direction; a first resisting member on a downstream side with respect to the heat sink and acting as a resistor for exhaust of the cooling air; and a second resisting member on the downstream side and on a first side that the fins are arranged respective to the heat sink and acting as a resistor for the cooling air. Distal ends of the fins on a second side that the fins are arranged are upstream of the distal ends of the fins on the first side.

20 Claims, 6 Drawing Sheets

(56) References Cited

U.S. PATENT DOCUMENTS

| | | | |
|---|---|---|---|
| 2002/0186532 A1* | 12/2002 | Tomioka | H05K 7/20154 361/679.48 |
| 2005/0061477 A1* | 3/2005 | Mira | H01L 23/467 257/E23.099 |
| 2008/0130232 A1 | 6/2008 | Yamamoto et al. | |
| 2008/0144279 A1 | 6/2008 | Yamamoto et al. | |
| 2012/0140403 A1* | 6/2012 | Lau | H05K 7/20336 361/679.48 |
| 2012/0281360 A1* | 11/2012 | Nicol | G16H 20/13 29/825 |
| 2013/0301214 A1* | 11/2013 | Bohm | G06F 1/20 361/709 |
| 2014/0313661 A1* | 10/2014 | Lin | G06F 1/30 361/679.32 |
| 2019/0227605 A1* | 7/2019 | Wiltzius | G06F 1/186 |
| 2020/0218317 A1* | 7/2020 | Shu | H05K 7/20009 |
| 2021/0235597 A1* | 7/2021 | Chopra | G02B 6/4269 |

FOREIGN PATENT DOCUMENTS

| | | |
|---|---|---|
| JP | 2008-140802 A | 6/2008 |
| JP | 2008-140803 A | 6/2008 |
| JP | 2018148187 A * | 9/2018 |

* cited by examiner

BOARD STRUCTURE, ELECTRONIC APPARATUS, AND METHOD OF MANUFACTURING BOARD STRUCTURE

CROSS-REFERENCE TO RELATED APPLICATIONS

This application is based on and claims priority under 35 USC 119 from Japanese Patent Application No. 2021-135481 filed Aug. 23, 2021.

BACKGROUND

(i) Technical Field

The present disclosure relates to a board structure, an electronic apparatus, and a method of manufacturing a board structure.

(ii) Related Art

Technologies relating to heat sinks that perform forcible cooling with cooling fans are disclosed by Japanese Unexamined Patent Application Publications No. 2008-140802 and No. 2008-140803. The technologies each specifically relate to a heat sink included in an inverter apparatus that converts alternating electric power generated by a commercial power source or the like into alternating electric power at a certain frequency and a certain voltage before supplying the power to an electric motor or the like.

In the heat sink disclosed by Japanese Unexamined Patent Application Publication No. 2008-140802, fins are arranged such that, in a flow direction in which cooling air flows, the distal ends of those fins that are substantially in front of a cooling fan reside at the upstreammost position, whereas the distal ends of those fins that are at the extreme ends in the widthwise direction of the heat sink reside at the downstreammost position. Each of the fins includes a sloping portion at the distal end thereof. The sloping portion slopes such that the height thereof from the base of the fin gradually increases from the upstream side toward the downstream side in the flow direction of the cooling air.

In the heat sink disclosed by Japanese Unexamined Patent Application Publication No. 2008-140803, a base member is provided with a heat generating component on one face thereof, and a plurality of fin members and an enclosure for receiving relevant components on the other face thereof. Some of the fin members that are at one lateral end of the heat sink and near the enclosure each have a cut that enables air suction or air exhaust through the lateral face of the heat sink.

SUMMARY

Aspects of non-limiting embodiments of the present disclosure relate to a heat sink with which a greater amount of cooling air is exhausted from a board, with a resisting member as a resistor for the cooling air to be exhausted being present on a first side in a fin arrangement direction with respect to the heat sink, than in a case where the distal ends, i.e., the downstream ends in a flow direction of the cooling air, of fins provided on a second side in the fin arrangement direction in the heat sink reside on the downstream side in the flow direction with respect to the distal ends of fins provided on the first side in the fin arrangement direction in the heat sink.

Aspects of certain non-limiting embodiments of the present disclosure address the above advantages and/or other advantages not described above. However, aspects of the non-limiting embodiments are not required to address the advantages described above, and aspects of the non-limiting embodiments of the present disclosure may not address advantages described above.

According to an aspect of the present disclosure, there is provided a board structure including: a board provided with a heat generating element; a heat sink including a plate-shaped base member having one face being in contact with the heat generating element, and a plurality of fins arranged side by side in a fin arrangement direction on an other face of the base member, the fins each extending in a flow direction in which cooling air flows, the fins each having a distal end at a downstream end in the flow direction; a first resisting member provided on a downstream side in the flow direction with respect to the heat sink, the first resisting member acting as a resistor for the cooling air to be exhausted; and a second resisting member provided on the downstream side in the flow direction and on a first side in the fin arrangement direction with respect to the heat sink, the second resisting member acting as a resistor for the cooling air to be exhausted, wherein the distal ends of the fins provided on a second side in the fin arrangement direction reside on an upstream side in the flow direction with respect to the distal ends of the fins provided on the first side.

BRIEF DESCRIPTION OF THE DRAWINGS

An exemplary embodiment of the present disclosure will be described in detail based on the following figures, wherein.

DETAILED DESCRIPTION

Exemplary Embodiment

An electronic apparatus to which a board structure according to an exemplary embodiment of the present disclosure is applied will now be described.
Electronic Apparatus An overall configuration of the electronic apparatus will first be described. In the drawings, two horizontal directions that are orthogonal to each other are defined as the X direction and the Y direction and are indicated by double-headed arrows X and Y, respectively. The vertical direction, which is orthogonal to the X and Y directions, is defined as the Z direction and is indicated by a double-headed arrow Z. A flow direction in which cooling air flows, to be described below, is indicated by an arrow K.

Figure 6:
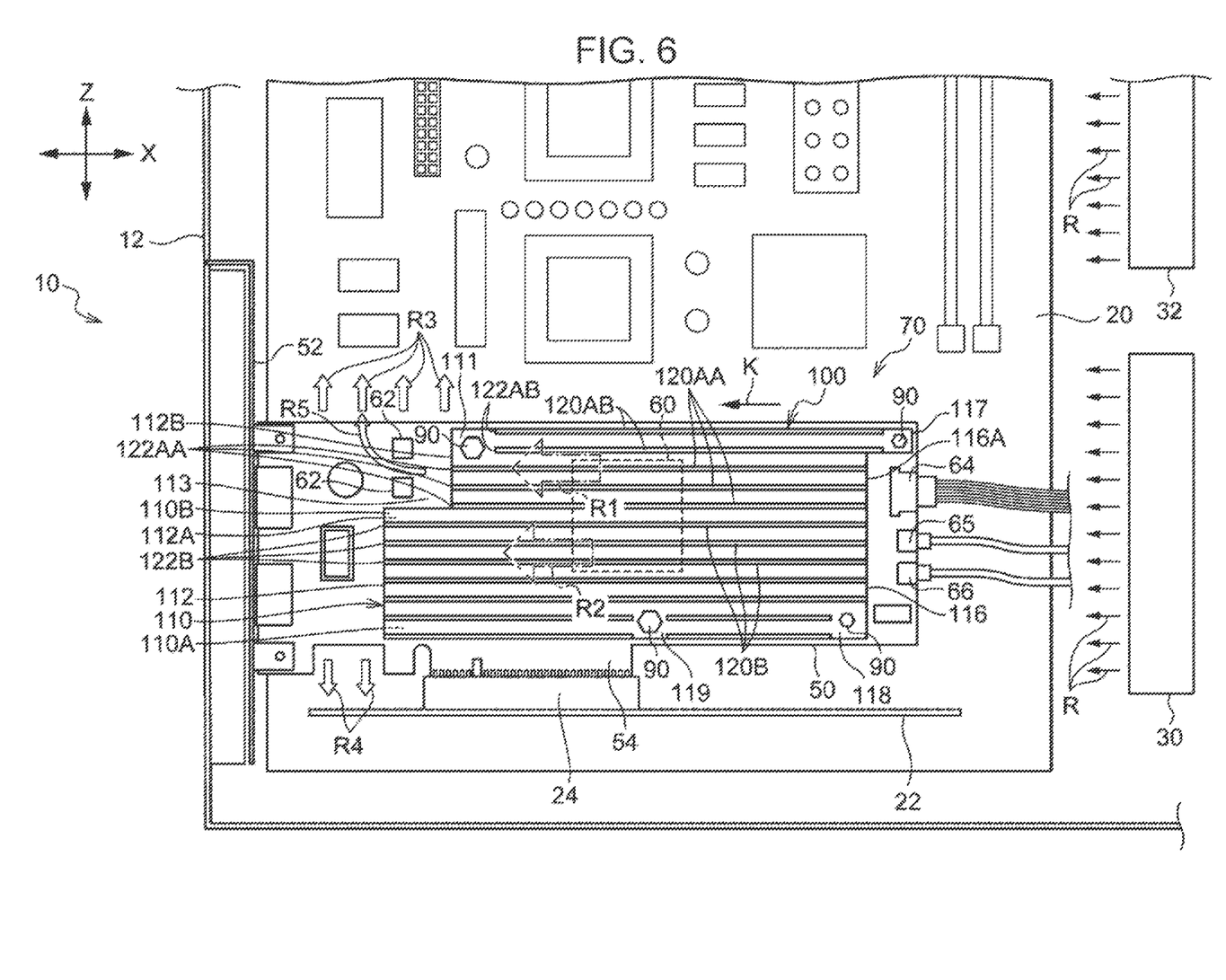
FIG. 6 is an internal front view of an electronic apparatus according to the exemplary embodiment, seen in the Y direction and illustrating relevant elements provided in a housing thereof.

The electronic apparatus, denoted by 10, according to the present exemplary embodiment illustrated in FIG. 6 is, but is not limited to, a server having an image processing function.

The electronic apparatus 10 has a housing 12, in which a motherboard 20, fans 30 and 32, and other relevant elements including a power source (not illustrated) are provided. The motherboard 20 is one of electronic circuit boards included in the electronic apparatus 10. The inside of the housing 12 of the electronic apparatus 10 is cooled with cooling air R generated by the fans 30 and 32.

Figure 2:
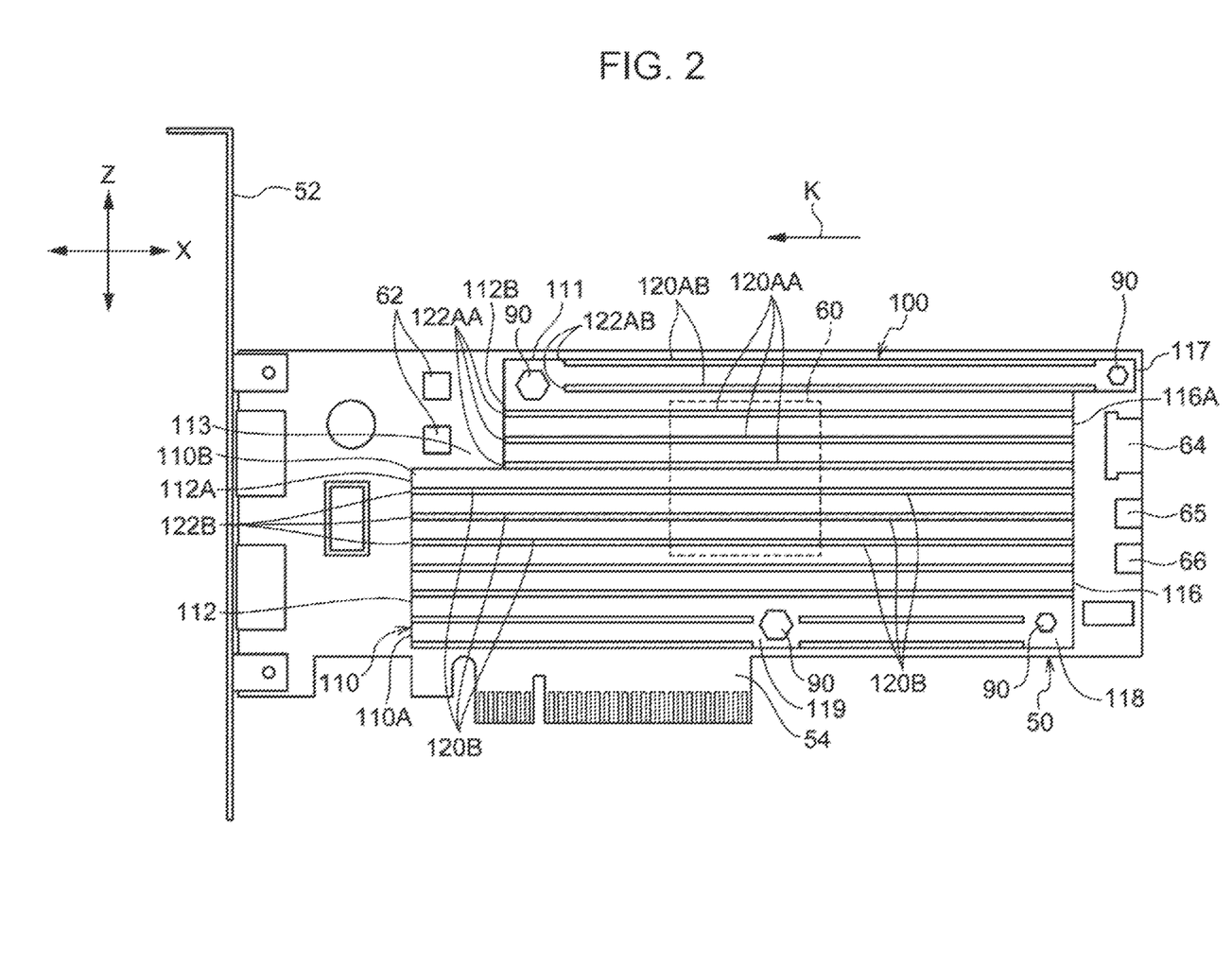
FIG. 2 is a plan view of an add-in board according to the exemplary embodiment, seen in the Y direction.

The motherboard 20 is provided with an add-in board 50 (see FIG. 2 as well). In the present exemplary embodiment, the add-in board 50 is mounted on the motherboard 20 with the aid of a riser card 22. Specifically, the add-in board 50 includes an insertion portion 54 (see FIG. 2 as well) on the lower side in the vertical direction. The insertion portion 54 is inserted into an add-in slot 24, which is provided on the riser card 22, and the riser card 22 is mounted on the motherboard 20.

The add-in board 50 is provided with a bracket 52 at an end thereof. The bracket 52 is made of sheet metal and is attached to the housing 12 with screws or the like, whereby the add-in board 50 is fixed to the housing 12.

Figure 1:
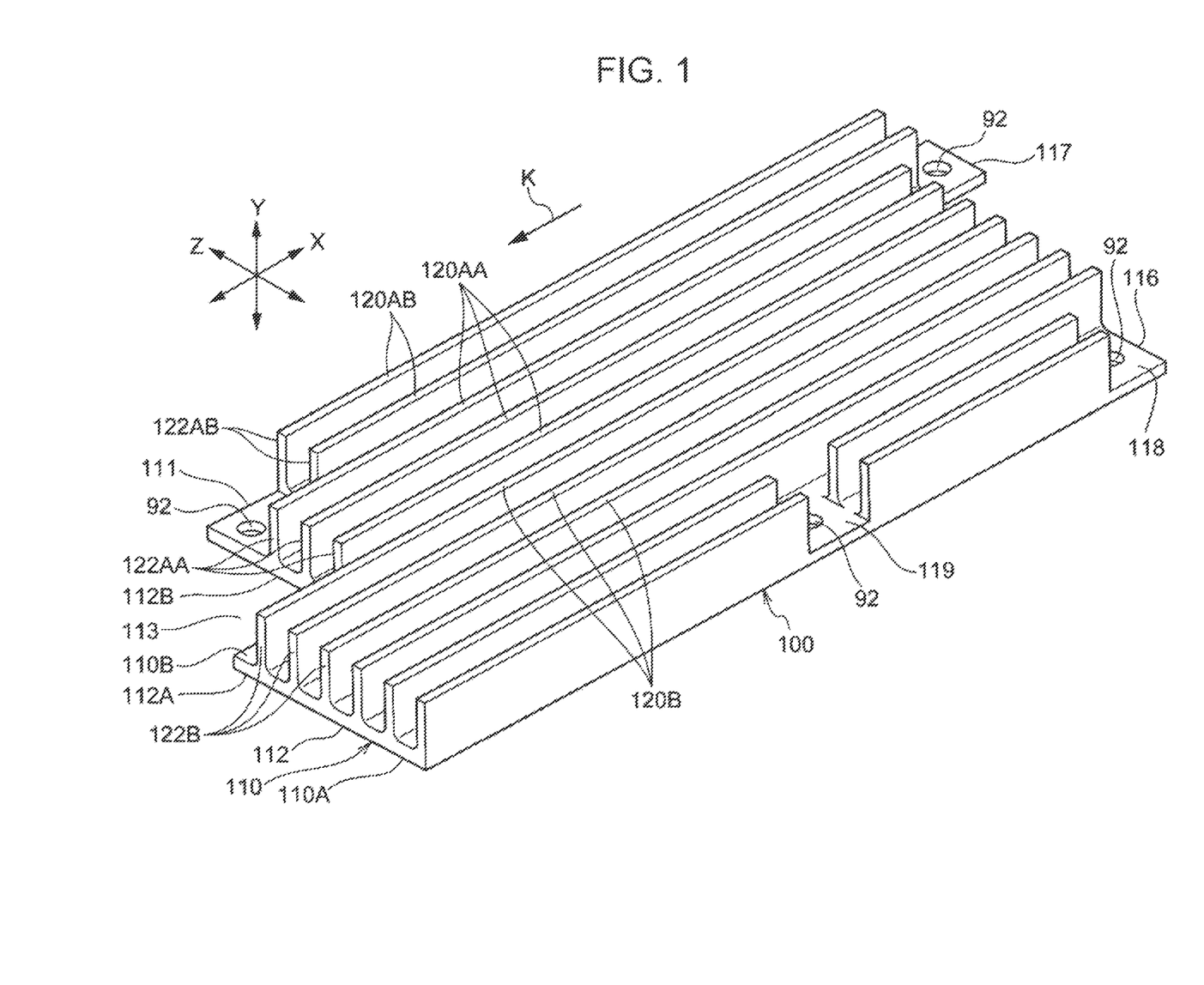
FIG. 1 is a perspective view of a heat sink according to an exemplary embodiment.

In the present exemplary embodiment, the add-in board 50 is oriented such that the faces thereof extend in the vertical direction. The fans 30 and 32 are provided on the right side with respect to the add-in board 50 in FIG. 1. The right side in FIG. 1 is defined as a first side in the X direction. Accordingly, the flow direction K of the cooling air R is the direction from the right side toward the left side in FIG. 1.

As illustrated in FIG. 2, the add-in board 50 is provided with a plurality of devices. Specifically, the add-in board 50 is provided in a central area thereof with an integrated circuit 60, which is an exemplary heat generating element. The integrated circuit 60 according to the present exemplary embodiment is, but is not limited to, a field-programmable gate array (FPGA).

The add-in board 50 is further provided with a heat sink 100 (see FIG. 1 as well). The heat sink 100 is made of a metal material such as aluminum, iron, or copper, which has good heat transfer characteristic. In the present exemplary embodiment, the heat sink 100 is fixed to the add-in board 50 with a plurality of screws 90.

As illustrated in FIGS. 1 and 2, the heat sink 100 includes a plate-shaped base member 110 and a plurality of fins 120AA, 120AB, and 120B.

As illustrated in FIG. 2, a first face 110A (see FIG. 1) of the base member 110 of the heat sink 100 is in contact with the integrated circuit 60. The plurality of fins 120AA, 120AB, and 120B are provided on a second face 110B of the base member 110.

In the present exemplary embodiment, the first face 110A (see FIG. 1) of the base member 110 is in contact with the integrated circuit 60 with a thermal sheet interposed therebetween. Instead of providing the thermal sheet, for example, grease may be applied to the integrated circuit 60 or the base member 110.

As illustrated in FIGS. 1 and 2, the plurality of fins 120AA, 120AB, and 120B are arranged side by side. The direction in which the plurality of fins 120AA, 120AB, and 120B according to the present exemplary embodiment are side by side is defined as the fin arrangement direction. The fin arrangement direction coincides with the vertical direction (the Z direction) (see FIGS. 2 and 6). In other words, the thickness direction of the base member 110 of the heat sink 100 coincides with the Y direction. In the vertical direction, the lower side is defined as the first side in the fin arrangement direction, and the upper side is defined as the second side in the fin arrangement direction.

The fins 120AA, the fins 120AB, and the fins 120B have the same specifications, except the lengths thereof, which will be described below separately. The fins 120AA, the fins 120AB, and the fins 120B are also connectively denoted as fins 120, omitting the suffixes AA, AB, and B from the reference signs thereof, if they do not need to be distinguished from one another.

The thickness direction of the fins 120 coincides with the fin arrangement direction (the vertical direction). The faces of the fins 120 each extend in the flow direction K of the cooling air R (see FIG. 6). Note that the direction in which the fins 120 extend do not necessarily need to exactly coincide with the flow direction K, as long as the cooling air R (see FIG. 6) is allowed to flow in a direction from the right side toward the left side in FIG. 2, which is the flow direction K.

As illustrated in FIG. 2, in the flow direction K, the bracket 52 is provided on the downstream side with respect to the add-in board 50. The bracket 52 acts as a resistor for the cooling air R to be exhausted toward the downstream side (the left side in FIG. 2) with respect to the add-in board 50. In the present exemplary embodiment, the bracket 52 is an exemplary first resisting member.

In the fin arrangement direction (the vertical direction), the riser card 22 is provided on the first side (the lower side) with respect to the add-in board 50. The riser card 22 acts as a resistor for the cooling air R to be exhausted toward the first side (the lower side) in the fin arrangement direction (the vertical direction). In the present exemplary embodiment, the riser card 22 is an exemplary second resisting member.

A board structure 70 according to the present exemplary embodiment includes the add-in board 50; the heat sink 100 including the plate-shaped base member 110 and the plurality of fins 120AA, 120AB, and 120B; the bracket 52 acting as a resistor for the cooling air R to be exhausted; and the riser card 22 acting as another resistor for the cooling air R to be exhausted.

As illustrated in FIGS. 1 and 2, the fins 120AA and 120AB provided on the second side (the upper side) of the heat sink 100 in the fin arrangement direction (the vertical direction) have respective distal ends 122AA and 122AB at the downstream end thereof in the flow direction K. The distal ends 122AA and 122AB reside on the upstream side (the right side in FIG. 2) in the flow direction K with respect to distal ends 122B of the fins 120B provided on the first side (the lower side) of the heat sink 100 in the fin arrangement direction.

Furthermore, the distal ends 122AA and 122AB of the fins 120AA and 120AB provided on the second side in the fin arrangement direction are retracted, from distal ends 122B of the fins 120B provided on the first side in the fin arrangement direction, toward the upstream side in the flow direction K by respective amounts that increase in a graded manner toward the second side in the fin arrangement direction. Specifically, the distal ends 122AB of the fins 120AB, which are uppermost two of the fins 120 provided on the second side (the upper side) in the fin arrangement direction (the vertical direction), reside on the upstream side with respect to the distal ends 122AA of the fins 120AA, which are provided on the first side with respect to the fins 120AB.

Furthermore, a downstream end 112 of the base member 110 of the heat sink 100 in the flow direction K includes a first-side end portion 112A and a second-side end portion 112B that are defined in the fin arrangement direction, and the second-side end portion 112B resides on the upstream side in the flow direction with respect to the first-side end portion 112A. Viewing from a different perspective, the base member 110 of the heat sink 100 has a rectangular cut 113 at a corner thereof between the downstream end and the second-side end. The base member 110 of the heat sink 100 has a screw hole 92 for a corresponding one of the screws 90 (see FIG. 2) in an area 111 between the second-side end portion 112B and the fins 120AB.

The base member 110 of the heat sink 100 includes an extended portion 117 at an upstream end 116 thereof in the flow direction K and on the second side (the upper side) in the fin arrangement direction. The extended portion 117 is extended toward the upstream side and has a screw hole 92 for a corresponding one of the screws 90 (see FIG. 2). On the other hand, lowermost two of the fins 120B provided on the first side in the fin arrangement direction are shortened in the flow direction K at the upstream end thereof, whereby an area 118 is provided in the base member 110 of the heat sink 100. Furthermore, the two fins 120B each have a break in a middle part thereof in the flow direction K, whereby an area 119 is provided in the base member 110. The areas 118 and 119 where none of the fins 120B are present have respective screw holes 92 for corresponding ones of the screws 90 (see FIG. 2).

As illustrated in FIGS. 2 and 6, the add-in board 50 is provided with power semiconductor devices 62, such as power transistors, in an area thereof on the downstream side with respect to the second-side end portion 112B at the downstream end 112 of the base member 110 of the heat sink 100. Viewing from a different perspective, the add-in board 50 is provided with the power semiconductor devices 62 in an area thereof exposed at the cut 113 of the base member 110 of the heat sink 100. The power semiconductor devices 62 are each an exemplary first heat generating component.

The add-in board 50 is further provided with a power-supply connector 64 in an area thereof on the upstream side with respect to a second-side end portion 116A at the upstream end 116 of the base member 110 of the heat sink 100. Specifically, the add-in board 50 is provided with the power-supply connector 64 and connectors 65 and 66 arranged side by side in an area thereof on the upstream side with respect to the upstream end 116 of the base member 110 of the heat sink 100, and the power-supply connector 64 resides on the second side with respect to the connectors 65 and 66. The power-supply connector 64 is an exemplary second heat generating component.

Functions

Functions exerted by the present exemplary embodiment will now be described.

As illustrated in FIG. 6, heat generated from the integrated circuit 60 mounted on the add-in board 50 is transmitted to the heat sink 100, and is released through the fins 120 and other relevant elements when the cooling air R generated by the fans 30 and 32 flows along the heat sink 100 (see arrows R1 and R2). Thus, the integrated circuit 60 is cooled.

The bracket 52 is provided on the downstream side in the flow direction K with respect to the add-in board 50. The bracket 52 acts as a resistor for the cooling air R to be exhausted toward the downstream side with respect to the add-in board 50. Therefore, none or little of the cooling air R having flowed along the heat sink 100 is exhausted toward the further downstream side. The cooling air R thus resisted then flows in the fin arrangement direction, which is the upward and downward directions in the present exemplary embodiment. In the present exemplary embodiment, the housing 12 also acts as a resistor for the cooling air R to be exhausted.

The riser card 22 is provided on the first side (the lower side) in the fin arrangement direction with respect to the add-in board 50. The riser card 22 acts as a resistor for the cooling air R to be exhausted. Therefore, the amount of cooling air R exhausted toward the first side (the lower side) is small (see arrows R4).

In contrast, no or substantially no resistors for the cooling air R to be exhausted are provided on the second side (the upper side) in the fin arrangement direction with respect to the add-in board 50. Therefore, an increased amount of cooling air R is exhausted toward the second side (the upper side) (see arrows R3).

In the board structure 70 according to the present exemplary embodiment, the distal ends 122AA and 122AB, which are the downstream ends in the flow direction K, of the fins 120AA and 120AB provided on the second side in the fin arrangement direction in the heat sink 100 reside on the upstream side in the flow direction K with respect to the distal ends 122B of the fins 120B provided on the first side in the fin arrangement direction in the heat sink 100.

Therefore, the heat sink 100 has a larger open area on the second side (the upper side) thereof, and the cooling air R is likely to flow toward the second side as illustrated by an arrow R5. Accordingly, a greater amount of cooling air R is exhausted from the add-in board 50 toward the second side than in a case where the distal ends 122AA and 122AB of the fins 120AA and 120AB provided on the second side reside on the downstream side with respect to the distal ends 122B of the fins 120B provided on the first side. In FIG. 6, the numbers of arrows R3 and R4 each correspond to the amount of cooling air R that is exhausted.

Since a greater amount of cooling air R (see the arrows R3) is exhausted from the add-in board 50 toward the second side, the velocity of the cooling air R flowing along the heat sink 100 is increased particularly for the cooling air R1 flowing on the second side.

In the present exemplary embodiment, on the second side in the fin arrangement direction in the heat sink 100, the distal ends 122AB of the fins 120AB reside on the upstream side with respect to the distal ends 122AA of the fins 120AA. Therefore, the heat sink 100 has a much larger open area on the second side (the upper side) thereof, and the cooling air R is more likely to flow toward the second side (see the arrow R5). Accordingly, the amount of cooling air R exhausted from the add-in board 50 increases.

In the present exemplary embodiment, the downstream end 112 of the base member 110 of the heat sink 100 in the flow direction K includes the first-side end portion 112A and the second-side end portion 112B that are defined in the fin arrangement direction, and the second-side end portion 112B resides on the upstream side in the flow direction K with respect to the first-side end portion 112A. Therefore, a greater amount of cooling air R is exhausted from the add-in board 50 than in a case where the second-side end portion and the first-side end portion, in the fin arrangement direction, at the downstream end 112 of the base member 110 of the heat sink 100 are at the same position in the flow direction K.

In the present exemplary embodiment, the add-in board 50 is provided with the power semiconductor devices 62 in the area thereof on the downstream side with respect to the second-side end portion 112B, in the fin arrangement direction, at the downstream end 112 of the base member 110 of the heat sink 100. The power semiconductor devices 62 are subjected to the cooling air R1 flowing at a high velocity.

In the present exemplary embodiment, the add-in board 50 is provided with the power-supply connector 64 in the area thereof on the upstream side with respect to the second-side end portion 116A, in the fin arrangement direction, at the upstream end 116 of the base member 110 of the heat sink 100. The power-supply connector 64 is subjected to the cooling air R1 flowing at a high velocity.

In the present exemplary embodiment, the add-in board 50 is oriented such that the fin arrangement direction coincides with the vertical direction and the second side in the fin arrangement direction coincides with the upper side in the direction of gravity. The cooling air R that is heated by flowing along the heat sink 100 and thus has a relatively reduced specific gravity tends to flow upward, i.e., toward the second side.

Modifications of Heat Sink

Modifications of the heat sink will now be described. Elements that are the same as those of the heat sink 100 according to the above exemplary embodiment are denoted by corresponding ones of the reference signs used in the above exemplary embodiment, and redundant description of such elements is omitted or simplified.

First Modification

Figure 3:
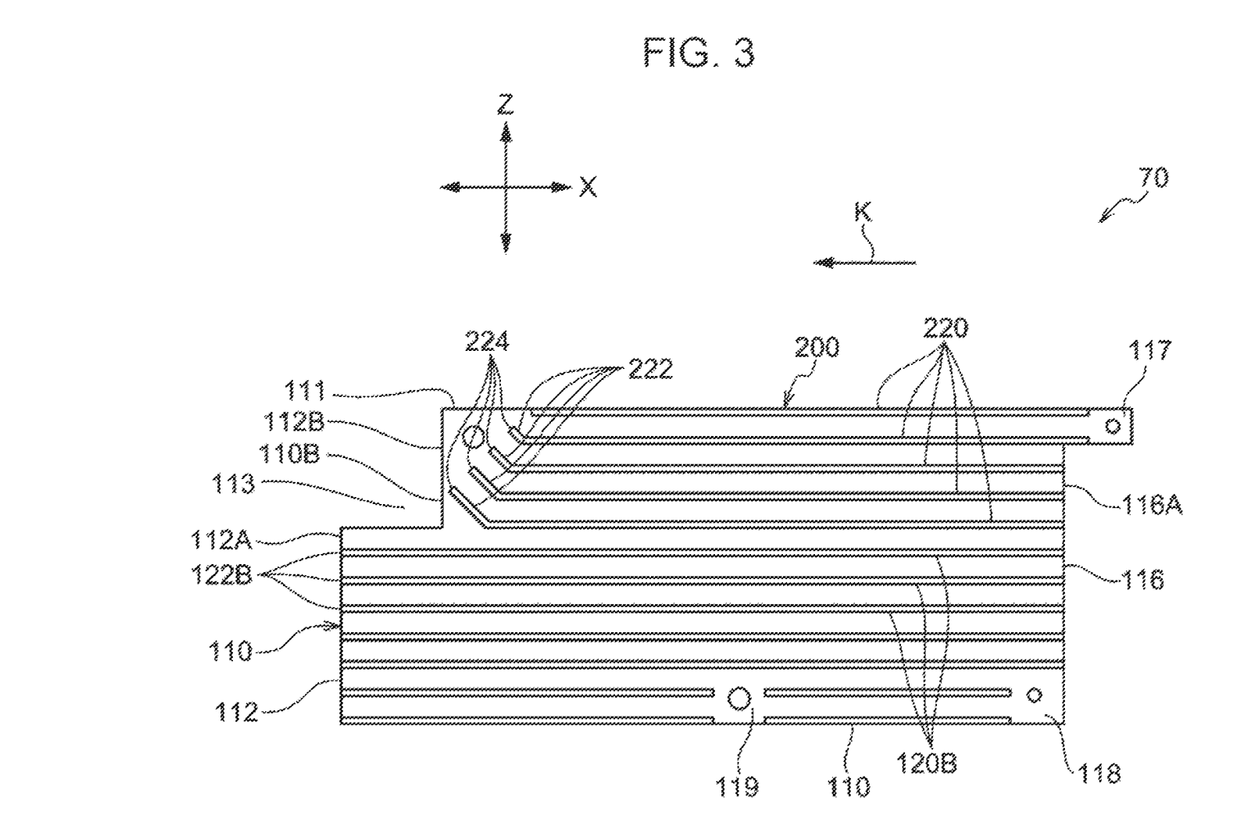
FIG. 3 is a plan view of a heat sink according to a first modification, seen in the Y direction.

A heat sink 200 according to a first modification illustrated in FIG. 3 includes a plate-shaped base member 110 and a plurality of fins 120B and 220. The plurality of fins 120B and 220 are arranged side by side. The fins 120B provided on the first side in the fin arrangement direction are the same as those of the above exemplary embodiment, and description thereof is omitted.

The fins 220 provided on the second side (the upper side) in the fin arrangement direction (the vertical direction) have distal ends 224 at the downstream end thereof in the flow direction K. The distal ends 224 reside on the upstream side in the flow direction K with respect to the distal ends 122B of the fins 120B provided on the first side (the lower side).

The fins 220 provided on the second side in the fin arrangement direction include respective downstream-end portions 222 on the downstream side thereof in the flow direction K. The downstream-end portions 222 are angled toward the second side. Furthermore, the distal ends 224 of the fins 220 provided on the second side are retracted toward the upstream side by respective amounts that increase toward the second side. Specifically, the distal ends 224 of the fins 220 provided on the second side are retracted toward the upstream side by respective amounts that continuously increase toward the second side.

Second Modification

Figure 4:
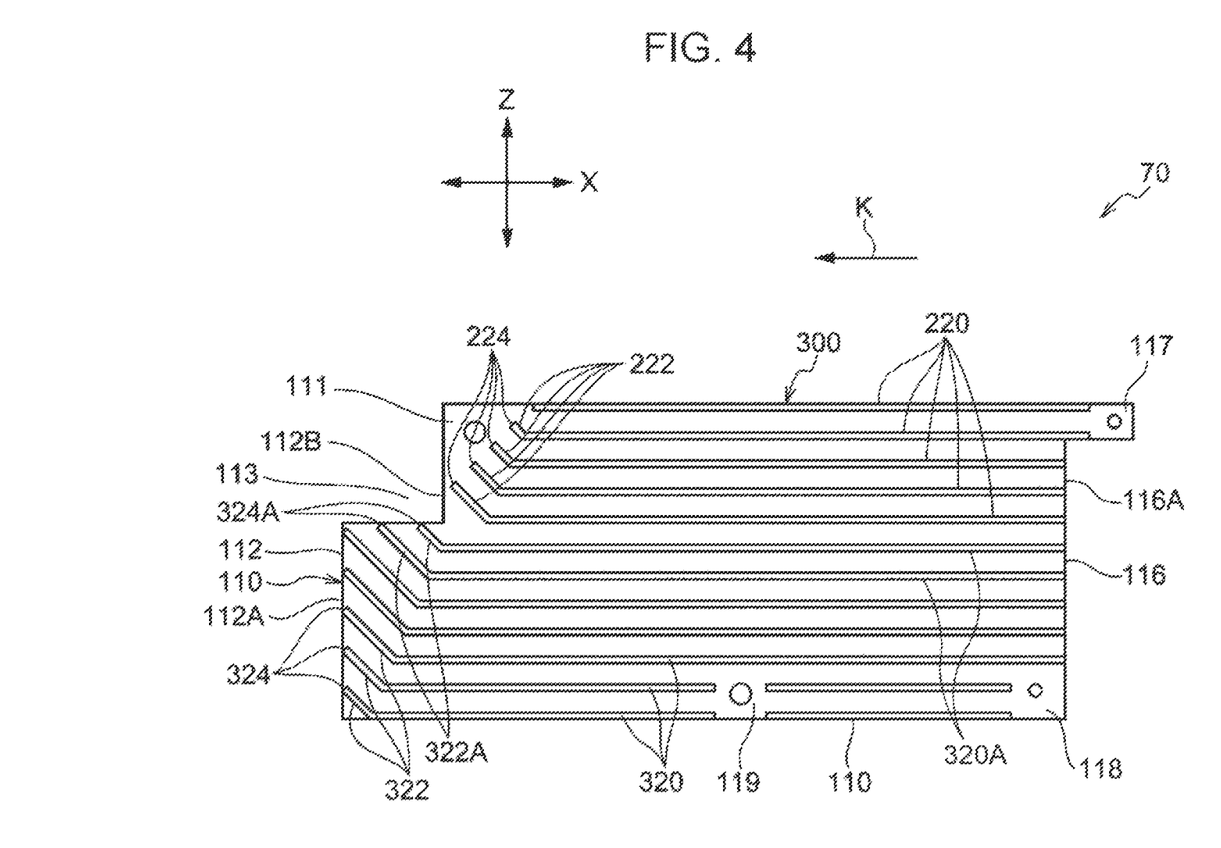
FIG. 4 is a plan view of a heat sink according to a second modification, seen in the Y direction.

A heat sink 300 according to a second modification illustrated in FIG. 4 includes a plate-shaped base member 110 and a plurality of fins 320, 320A, and 220. The fins 220 provided on the second side in the fin arrangement direction are the same as those of the first modification, and detailed description thereof is omitted.

The fins 220 provided on the second side (the upper side) in the fin arrangement direction (the vertical direction) have the distal ends 224 at the downstream end thereof in the flow direction K. The distal ends 224 reside on the upstream side in the flow direction K with respect to distal ends 324 and 324A of the fins 320 and 320A provided on the first side (the lower side).

The fins 320 and 320A provided on the first side in the fin arrangement direction include respective downstream-end portions 322 and 322A on the downstream side thereof in the flow direction K. The downstream-end portions 322 and 322A are angled toward the second side. The distal ends 324 of the fins 320 provided on the first side are at the same position in the flow direction K. The distal ends 324A of the fins 320A, which are provided on the second side in the fin arrangement direction with respect to the fins 320, reside on the upstream side in the flow direction K with respect to the distal ends 324.

The distal ends 324A of the fins 320A provided on the second side with respect to the fins 320 are retracted toward the upstream side by respective amounts that increase toward the second side. In other words, the distal ends 324A of the fins 320A provided on the second side are retracted toward the upstream side by respective amounts that continuously increase toward the second side.

Third Modification

Figure 5:
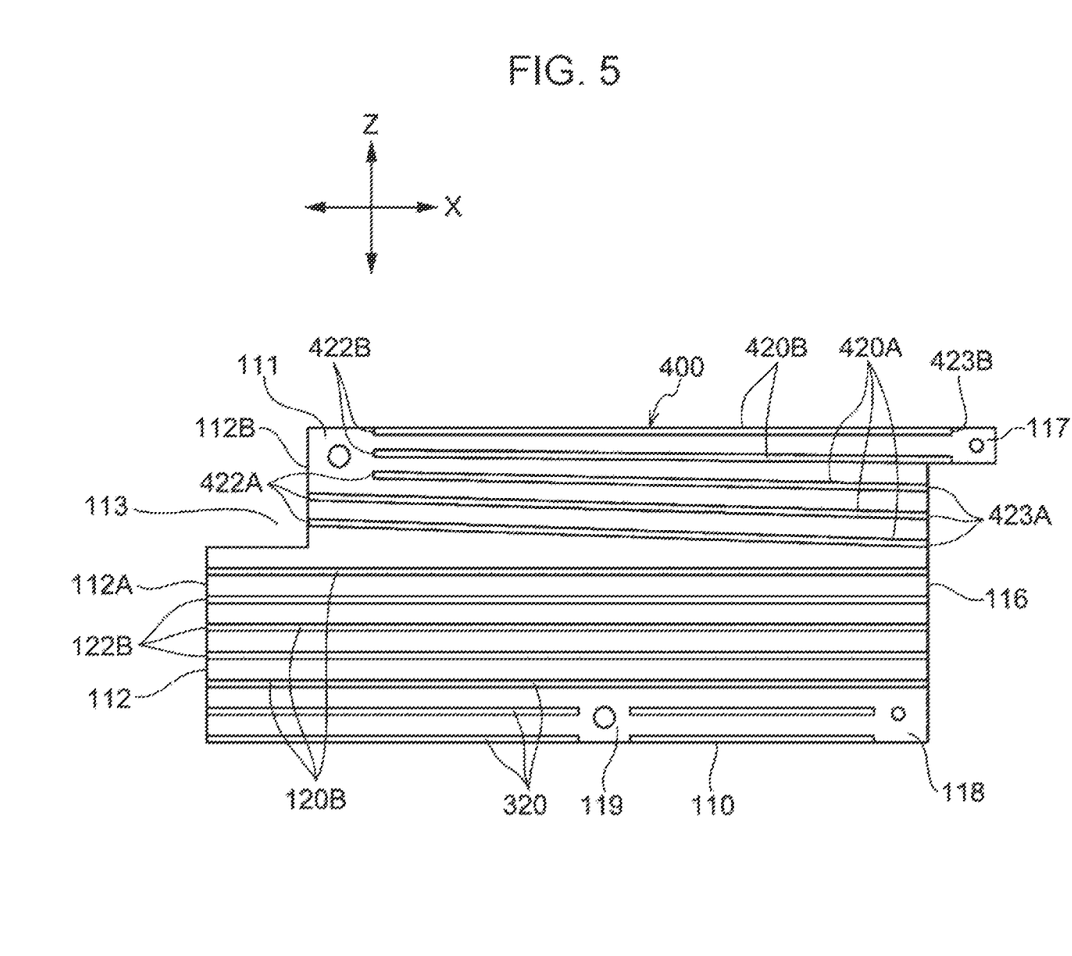
FIG. 5 is a plan view of a heat sink according to a third modification, seen in the Y direction.

A heat sink 400 according to a third modification illustrated in FIG. 5 includes a plate-shaped base member 110 and a plurality of fins 120B, 420A, and 420B. The plurality of fins 120B, 420A, and 420B are arranged side by side. The fins 120B provided on the first side in the fin arrangement direction are the same as those of the above exemplary embodiment, and description thereof is omitted.

The fins 420A and 420B provided on the second side in the fin arrangement direction are each generally angled toward the second side in the fin arrangement direction, with distal ends 422A and 422B at the downstream end thereof residing on the second side in the fin arrangement direction with respect to proximal ends 423A and 423B at the upstream end thereof. Therefore, the interval in the fin arrangement direction between adjacent ones of the fins 420A and 420B provided on the second side is smaller at the distal ends 422A and 422B than at the proximal ends 423A and 423B.

The distal ends 422A and 422B, i.e., the downstream ends in the flow direction K, of the fins 420A and 420B provided on the second side in the fin arrangement direction reside on the upstream side in the flow direction K with respect to the distal ends 122B of the fins 120B provided on the first side (the lower side).

Furthermore, the distal ends 422B of the fins 420B provided on the second side in the fin arrangement direction reside on the upstream side with respect to the distal ends 422A of the fins 420A provided on the first side with respect to the fins 420B.

Other Configurations

The present disclosure is not limited to the above exemplary embodiment and the modifications thereof.

For example, while the add-in board 50 and the base member 110 of the heat sink 100, 200, 300, or 400 according to each of the above exemplary embodiment and the modifications thereof are oriented such that the faces thereof extend in the vertical direction, the add-in board 50 and the base member 110 are not limited thereto. The add-in board 50 and the base member 110 may be oriented such that the faces thereof extend horizontally or inclined with respect to the horizontal direction.

While the fans 30 and 32 according to each of the above exemplary embodiment and the modifications thereof are provided on the outer side in the X direction with respect to the add-in board 50 and generate cooling air R that flows from the right side toward the left side in the drawings, the positions of the fans are not limited thereto. The fans may be provided at any positions, including positions above or below the add-in board, or at the back of the add-in board.

In such a case, the cooling air R may be made to flow along the heat sink by using any element such as a duct.

While each of the above exemplary embodiment and the modifications thereof takes the bracket 52 as an exemplary first resisting member, the first resisting member is not limited thereto. The first resisting member may be any component or member, such as a housing; a frame; a subsidiary board; or a component provided on a board, as long as the component or member is provided on the downstream side with respect to the heat sink and acts as a resistor for the cooling air to be exhausted toward the further downstream side.

While each of the above exemplary embodiment and the modifications thereof takes the riser card 22 as an exemplary second resisting member, the second resisting member is not limited thereto. The second resisting member may be any component or member, such as a housing; a frame; a bracket; or a component provided on a board, as long as the component or member is provided on the downstream side and on the first side with respect to the heat sink and acts as a resistor for the cooling air to be exhausted toward the second side.

While each of the above exemplary embodiment and the modifications thereof takes the add-in board 50 as an exemplary board, the board is not limited thereto. The board may be a motherboard, for example.

While each of the above exemplary embodiment and the modifications thereof takes the integrated circuit 60 as an exemplary heat generating element, the heat generating element is not limited thereto. The heat generating element may be any device that generates heat when energized, for example, a central processing unit.

The foregoing description of the exemplary embodiments of the present disclosure has been provided for the purposes of illustration and description. It is not intended to be exhaustive or to limit the disclosure to the precise forms disclosed. Obviously, many modifications and variations will be apparent to practitioners skilled in the art. The embodiments were chosen and described in order to best explain the principles of the disclosure and its practical applications, thereby enabling others skilled in the art to understand the disclosure for various embodiments and with the various modifications as are suited to the particular use contemplated. It is intended that the scope of the disclosure be defined by the following claims and their equivalents.

What is claimed is:

1. A board structure comprising:
    a board with a heat generating element;
    a heat sink including a base member that is plate-shaped and having one face in contact with the heat generating element, and fins arranged side by side in a fin arrangement direction on another face of the base member, the fins each extending in a flow direction in which cooling air flows, the fins each having a distal end at a downstream end in the flow direction;
    a first resisting member on a downstream side in the flow direction with respect to the heat sink, the first resisting member acting as a resistor for the cooling air to be exhausted; and
    a second resisting member on the downstream side in the flow direction and on a first side in the fin arrangement direction with respect to the heat sink, the second resisting member acting as a resistor for the cooling air to be exhausted, wherein
    the distal ends of the fins on a second side in the fin arrangement direction are on an upstream side in the flow direction with respect to the distal ends of the fins on the first side, and
    the first resisting member and the second resisting member are configured so that more of the cooling air is exhausted toward the second side than the first side after exiting the fins.

2. The board structure according to claim 1,
wherein a downstream end of the base member of the heat sink in the flow direction includes a first-side portion and a second-side portion in the fin arrangement direction, and the second-side portion is on the upstream side in the flow direction with respect to the first-side portion.

3. The board structure according to claim 2,
wherein the board includes a first heat generating component in an area on the downstream side with respect to the second-side portion of the downstream end of the base member.

4. The board structure according to claim 1,
wherein the distal ends of the fins on the second side in the fin arrangement direction in the heat sink are retracted, from the distal ends of the fins on the first side in the heat sink, toward the upstream side in the flow direction by respective amounts that increase in a graded manner or in a continuous manner toward the second side.

5. The board structure according to claim 2,
wherein the distal ends of the fins on the second side in the fin arrangement direction in the heat sink are retracted, from the distal ends of the fins on the first side in the heat sink, toward the upstream side in the flow direction by respective amounts that increase in a graded manner or in a continuous manner toward the second side.

6. The board structure according to claim 3,
wherein the distal ends of the fins on the second side in the fin arrangement direction in the heat sink are retracted, from the distal ends of the fins on the first side in the heat sink, toward the upstream side in the flow direction by respective amounts that increase in a graded manner or in a continuous manner toward the second side.

7. The board structure according to claim 1,
wherein the board includes a second heat generating component in an area on the upstream side with respect to an upstream end of the heat sink in the flow direction on the second side in the fin arrangement direction.

8. The board structure according to claim 2,
wherein the board includes a second heat generating component in an area on the upstream side with respect to an upstream end of the heat sink in the flow direction on the second side in the fin arrangement direction.

9. The board structure according to claim 3,
wherein the board includes a second heat generating component in an area on the upstream side with respect to an upstream end of the heat sink in the flow direction on the second side in the fin arrangement direction.

10. The board structure according to claim 4,
wherein the board includes a second heat generating component in an area on the upstream side with respect to an upstream end of the heat sink in the flow direction on the second side in the fin arrangement direction.

11. The board structure according to claim 5,
wherein the board includes a second heat generating component in an area on the upstream side with respect to an upstream end of the heat sink in the flow direction on the second side in the fin arrangement direction.

12. The board structure according to claim 6,
wherein the board includes a second heat generating component in an area on the upstream side with respect to an upstream end of the heat sink in the flow direction on the second side in the fin arrangement direction.

13. The board structure according to claim 1,
wherein a portion of each of the fins on the second side in the fin arrangement direction in the heat sink are each angled toward the second side on the downstream side in the flow direction.

14. The board structure according to claim 2,
wherein a portion of each of the fins on the second side in the fin arrangement direction in the heat sink are each angled toward the second side in on the downstream side in the flow direction.

15. The board structure according to claim 13,
wherein a portion of each of the fins on the second side and the first side in the fin arrangement direction in the heat sink are each angled toward the second side in on the downstream side in the flow direction.

16. The board structure according to claim 1,
wherein an interval between adjacent ones of the fins on the second side in the fin arrangement direction in the heat sink is smaller on the downstream side than on the upstream side.

17. The board structure according to claim 16,
wherein the fins on the second side in the fin arrangement direction in the heat sink are each angled toward the second side.

18. The board structure according to claim 1,
wherein the board is oriented such that a portion on the second side in the fin arrangement direction is on an upper side in a direction of gravity with respect to a portion on the first side in the fin arrangement direction.

19. An electronic apparatus comprising the board structure according to claim 1.

20. A method of manufacturing a board structure comprising:
providing a heat generating element on a board;
providing a heat sink on the board, the heat sink including a base member that is plate-shaped and having one face in contact with the heat generating element and fins arranged side by side in a fin arrangement direction on another face of the base member, the fins each extending in a flow direction in which cooling air flows, the fins each having a distal end at a downstream end in the flow direction;
providing a first resisting member on a downstream side in the flow direction with respect to the heat sink, the first resisting member acting as a resistor for the cooling air to be exhausted; and
providing a second resisting member on the downstream side in the flow direction and on a first side in the fin arrangement direction with respect to the heat sink, the second resisting member acting as a resistor for the cooling air to be exhausted, wherein
the distal ends of the fins on a second side in the fin arrangement direction are on an upstream side in the flow direction with respect to the distal ends of the fins on the first side, and
the first resisting member and the second resisting member are configured so that more of the cooling air is exhausted toward the second side than the first side after exiting the fins.

* * * * *